United States Patent
Sternowski (10) Patent No.: US 7,382,185 B1
(45) Date of Patent: Jun. 3, 2008

(54) LOOP SEGMENT SWITCHING SYSTEM

(75) Inventor: Robert H. Sternowski, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 851 days.

(21) Appl. No.: 10/938,806

(22) Filed: Sep. 10, 2004

(51) Int. Cl.
*H03F 3/68* (2006.01)

(52) U.S. Cl. ............... 330/124 R; 330/124 D; 330/126; 330/51

(58) Field of Classification Search ............ 330/124 R, 330/124 D, 126, 51
See application file for complete search history.

(56) References Cited

U.S. PATENT DOCUMENTS

| | | | | |
|---|---|---|---|---|
| 3,731,217 | A * | 5/1973 | Gerst et al. ............... | 330/56 |
| 4,825,172 | A * | 4/1989 | Thompson ............... | 330/124 R |
| 5,146,190 | A * | 9/1992 | Firmain ................... | 333/117 |
| 5,724,352 | A * | 3/1998 | Cloonan et al. ........... | 370/388 |
| 6,018,644 | A * | 1/2000 | Minarik ................... | 455/82 |
| 7,293,090 | B1 * | 11/2007 | Saleh et al. ............... | 709/226 |

* cited by examiner

*Primary Examiner*—Patricia Nguyen
(74) *Attorney, Agent, or Firm*—Nathan O. Jensen; Kyle Eppele (57) ABSTRACT

The loop segment switching system includes a plurality of signal sources, each producing an output signal; and, a plurality of signal sinks, each signal sink normally accepting an output signal from an associated signal source and for increasing the power of the output signal to a desired level. A node switching system of the loop segment switching system includes a plurality of switch nodes and control means. Each switch node, in its basic form, includes a first relay, a second relay, and a third relay. Associated signal sources and amplifiers are normally connected to each other via the third relay. The switch nodes are normally connected in one continuous interconnecting loop from the first relay of a node to the second relay of an adjacent node. The control means is connected to the switch nodes for activating the plurality of switch nodes in order to reconnect signal sources and signal sinks from the normal connection in the event of a failure of a signal source or a signal sink. The reconnections are implemented by disconnecting a segment of the interconnecting loop and using that segment as a connection between the desired signal source and signal sink.

20 Claims, 9 Drawing Sheets

LOOP SEGMENT SWITCHING SYSTEM

BACKGROUND OF THE INVENTION

1. Field of the Invention

The present invention relates to switching systems and more particularly to switching systems that require switching between multiple signal sources and multiple signal sinks. It is particularly useful for modular, multiple radio systems. It utilizes a loop segment switching scheme that obviates the requirement of matrix switching.

2. Description of the Related Art

Modern modular radio systems typically utilize a "pool" of exciters to generate low power signals with a selected frequency and modulation, and a "pool" of power amplifiers which increase the low level signal from an exciter to the desired radiated power level. The system generally maps one exciter to one power amplifier. Connecting more than one exciter to a single power amplifier raises issues with linearity versus generation of spurious intermodulation distortion (IMD) products, and peak envelope power (PEP) derating of the amplifier with multiple signals (whereby the vector voltage limited power amplifier must have the input signals reduced such that the peak vector voltage input of multiple signals times the amplifier gain does not exceed the peak voltage output capacity of the amplifier to prevent severe IMD product generation).

In designing modern modular radio systems the designer is faced with an architectural challenge based on the fact that the system configuration uses modular exciters and banded amplifiers. There is a choice as to whether the exciter is hardwired to the amplifier or whether to provide a switch matrix to allow connection of any exciter output to any amplifier input. The reason for wanting to switch them is for fault tolerance, and being able to reroute around failed modules.

One of the key features of the new modular radio systems (typified by the US Department of Defense Joint Tactical Radio System (JTRS) is that the exciter module is capable of operating at output frequencies of 2-2000 MHz with selectable software-generated bandwidths and modulations. That is to say that the exciter is common across all frequencies, modes and waveforms. Modes and frequencies may be changed in multiples of microseconds to milliseconds without physical action; all features are switchable/selectable via software command busses.

On the other hand, the high power RF and antenna subsystem is generally still banded due to component and physics limitations. Typically, a military radio system is divided by frequency bands and their unique band attributes as follows:

HF (2-30 MHz) has 1000 watts transmitter output or more due to link power budget and atmospheric noise considerations, with physically large (35-50 feet tall) antennas commensurate with the wavelength; narrowband linear 3 KHz waveforms.

VHF Combat Net Radio (30-88 MHz) has 50 watt transmitters with 8-10 foot tall antennas, operates in line-of-sight (LOS) modes to manpack or handheld radios from larger base stations on platforms or movable command posts; non-linear narrowband waveforms on 25 KHz channelization.

UHF (225400 MHz) has 100 watt transmitters with 2-3 foot tall antennas, operates in LOS modes among platforms and movable command posts; linear and non-linear narrowband waveforms on 25 KHz channelization except special waveforms up to several megahertz bandwidth.

UHF SATCOM (240-318 MHz) has 200 watt transmitters with steerable directional antennas; linear and non-linear narrowband waveforms of 5 or 25 KHz; four 200 watt transmitters combined into one antenna via −6 db combining network, net of 50 watts per channel radiated power.

High UHF (>400 MHz) uses 100 watt transmitters (with exception of JTIDS, with dedicated higher power transmitters and antennas) with 1-2 foot tall antennas; linear and non-linear waveforms up to ten's of megahertz wide.

The point of the description of the transmitters used is that each band has a unique power output and power amplifier requirement. With modern technology and these differing requirements, the amplifiers generally used to satisfy the total frequency coverage needs include:

HF: Due to the high power needs, the HF amplifiers are segmented as separate devices operating only 2-30 MHz. High power devices with sufficiently large junctions typically have unsatisfactory characteristics for VHF/UHF operation.

VHF/UHF: The state-of-the-art allows construction of 30450 MHz 100 watt amplifiers, both linear and non-linear, using LDMOS silicon devices. Two or more amplifers are coherently hybrid-combined for higher power outputs (i.e., for satellite communications). Current LDMOS silicon devices cannot be broadbanded to obtain 30-2000 MHz in a single amplifier.

>450 MHz UHF: The state-of-the-art is shaky in this frequency range. Silicon devices are usable up to 2000 MHz, but due to the rapidly decreasing gain (up to a usable limit of about 2000 MHz), must be tuned and cannot be broadbanded except over a small band (typically 5-10% of tuned frequency). GaN and GaAs devices are not yet available with sufficient power density, and SiC devices are just being introduced into the market. Hence this band is typically covered with banded amplifiers.

Thus, in summary multiple banded amplifiers are required to meet the operational requirements of present military radio systems. However, one common exciter module can generate low level signals for all bands.

A particular example of the problem facing large multiple radio systems involves those found on military ships that may have upwards of twenty-five to fifty radios. These are traditionally connected to an RF crosspoint matrix switch to allow the system to reroute around failures and maintain critical communications circuits in the face of those failures. Newer systems being proposed under the Joint Tactical Radio System (JTRS) program may have closer to one-hundred channel radio systems, using common modular components, requiring a 100×100 RF matrix switch to achieve the traditional reconfigurability. Such a large size RF matrix switch will be heavy, expensive, and itself a reliability risk relative to the systems it is to reroute.

In attempting to determine whether to hardwire an exciter to an amplifier, or provide a switch matrix to allow connecting any exciter output to any amplifier input some of the factors to be considered are:

What is the mean time between failure (MTBF) and availability of the system with hardwired versus switched exciter/amplifier pairs?

What is the cost of an exciter crosspoint switch matrix?

Is the baseband switch at the digital input of the exciter sufficient switching, given that all exciters can operate at any mode and frequency?

This becomes a complex system trade. The motivation for wanting to switch any exciter to any amplifier/antenna must be understood, given that any exciter can generate any waveform at any frequency. The primary motivation is that the failure of an exciter would leave an unused amplifier/ antenna channel. This could be resolved by matrix-switching a replacement or spare exciter into that amplifier, or simply having sufficient exciter and amplifier spares in each band to provide the required reliability/availability without switching (e.g., hardwired).

Assuming for discussion that switching is justified, then large systems (64 to 80 exciters) which require connecting any exciter to any amplifier would require a commensurate crosspoint matrix, which is a large and expensive hardware item, albeit one available as COTS.

Although the discussion above has been directed toward modular, multiple radio systems similar switching problems are equally applicable in many areas where switching is required between multiple sources and multiple sinks such in optical switching, data communications, energy related systems, etc. As will be disclosed below, the principles of the present invention apply equally to a variety of fields.

SUMMARY OF THE INVENTION

In a broad aspect, the present invention is a loop segment switching system for switching among signal sources and signal sinks. The loop segment switching system includes a plurality of signal sources, each producing an output signal; and, a plurality of signal sinks, each signal sink normally accepting an output signal from an associated signal source and for increasing the power of the output signal to a desired level. A node switching system of the loop segment switching system includes a plurality of switch nodes and control means. Each switch node, in its basic form, includes a first relay, a second relay, and a third relay. Associated signal sources and amplifiers are normally connected to each other via the third relay. The switch nodes are normally connected in one continuous interconnecting loop from the first relay of a node to the second relay of an adjacent node. The control means is connected to the plurality of switch nodes for activating the plurality of switch nodes in order to reconnect signal sources and signal sinks from the normal connection in the event of a failure of a signal source or a signal sink. The reconnections are implemented by disconnecting a segment of the interconnecting loop and using that segment as a connection between the desired signal source and signal sink.

As noted above, the present invention is particularly useful in application with modular, multiple radio systems. As an alternative approach to a crosspoint matrix the present invention capitalizes on two key assumptions:

1. Each exciter can be quickly reconfigured for any mode at any frequency; and,
2. It is unlikely that the majority of exciters will fail simultaneously.

The advantages of a loop segment switching scheme versus a crosspoint matrix, where there are N exciters and N amplifiers, include:

1. Any exciter can be connected (under computer control) to any amplifier.
2. There are only three SPDT relays (3N total) for each switched exciter versus N×N total in a crosspoint switch matrix. Therefore, it is much less expensive than such an N×N crosspoint.
3. It has similar functional capability as an N×N crosspoint.
4. There is substantial rack/floor space, cabling size/ weight, procurement/support cost required for a crosspoint matrix. These are all minimized with the present loop segment switching scheme.

These same advantages are analogous in a variety of applications as will be discussed below.

DETAILED DESCRIPTION OF THE INVENTION

Figure 1:
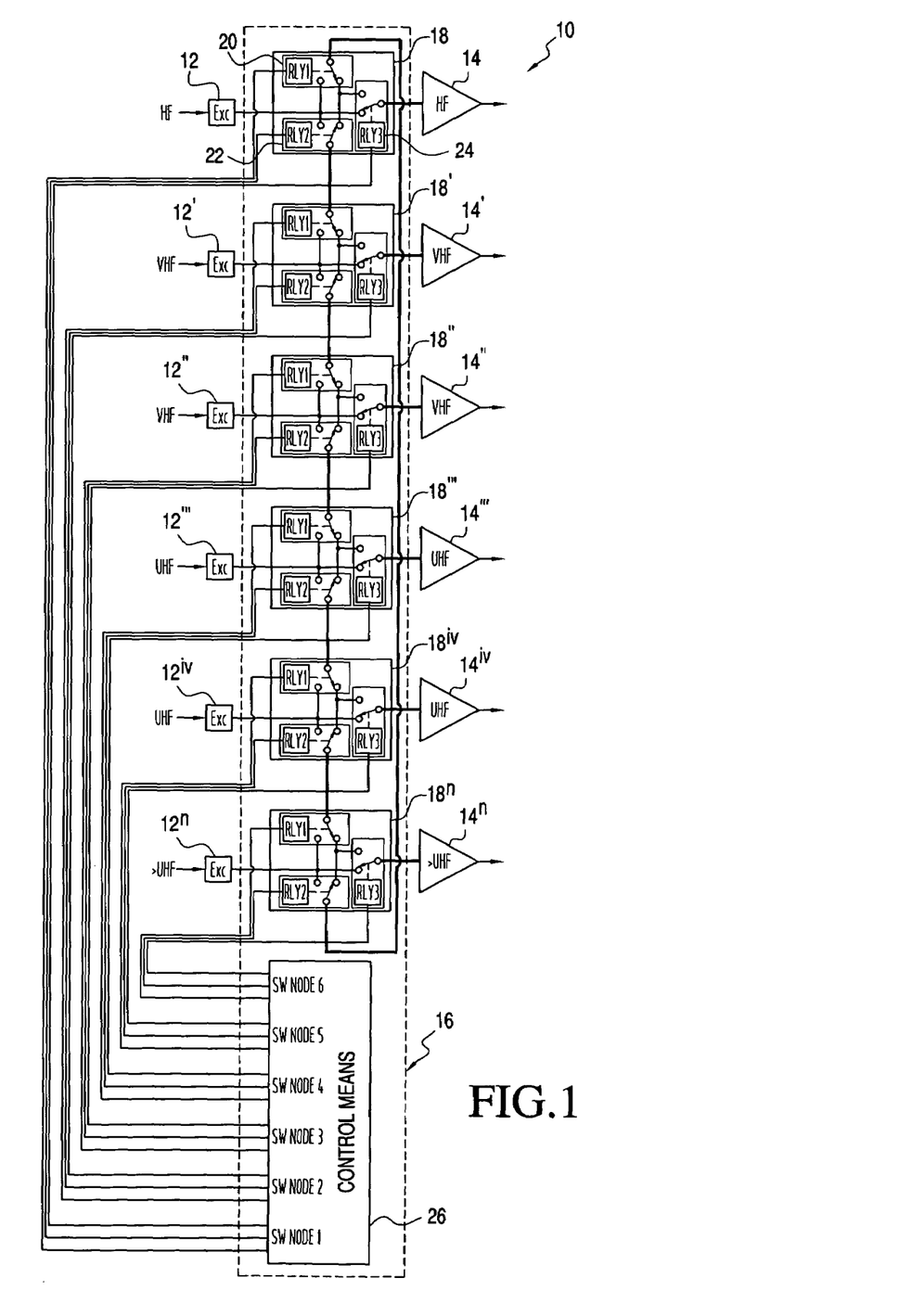
FIG. 1 is a schematic diagram of the loop switching system of the present invention with all exciters operating with no failures.

Referring now to the drawings and the characters of reference marked thereon, FIG. 1 illustrates a preferred embodiment of the loop switching system of the present invention, designated generally as 10, in normal (no failures) operation. The loop switching system 10 includes a plurality of signal sources, i.e. exciters 12, 12', 12", 12''', $12^{iv}$, ... $12^n$; and, a plurality of signal sinks, i.e. amplifiers 14, 14', 14", 14''', $14^{iv}$, ... $14^n$. Each exciter output is normally routed to an associated amplifier 14. In FIG. 1 all exciters 12 are operating. There are no failures. Each exciter 12 produces a low-power radio output signal with the selected modulation at the selected frequency. As used herein the term "low-power" refers to power levels generally less than 1 watt across 50 ohms impedance.

Each amplifier 14 accepts one of the low-power radio output signals from an associated exciter 12 and linearly increases the power of the output signal to a desired level suitable for the system purpose. The plurality of amplifiers may comprise a mix of units each exhibiting a different power, frequency and amplification function, e.g., a unique inherent maximum power output, operation restricted to one frequency band, and linear or non-linear amplification.

An electronically operated node switching system, designated generally as 16, includes a plurality of switch nodes, designated generally as 18, 18', 18", ..., $18^n$. Each switch node includes a first relay 20, a second relay 22 and a third relay 24. An exciter 12 and its associated amplifier 14 are operationally normally connected to each other via the third relay 24. Switch nodes 18, 18', 18", ..., $18^n$ are connected in one continuous loop from the first relay 20 of a node 18 to a respective second relay 22 of an adjacent node.

Control means 26 is connected to the switch nodes 18 for activating the switch nodes 18 in the event of one or more exciter 12 failures in order to reconnect exciters 12 and amplifiers 14 from their normal connection. The control means 26 selects switch node relay positions based upon operator inputs and/or failure information from the exciters 12 and/or amplifiers 14. Preprogrammed rules determine the reconnections. The reconnections are implemented by disconnecting a portion (i.e. segment) of the interconnecting loop and using that portion as a connection between the desired exciter 12 and amplifier 14, as will be discussed below in detail.

The control means may include, for example, suitable software and a computer system. Relay switching decisions may be made automatically by software implemented rules, or manually by an operator via console inputs from system-generated failure awareness.

Figure 2:
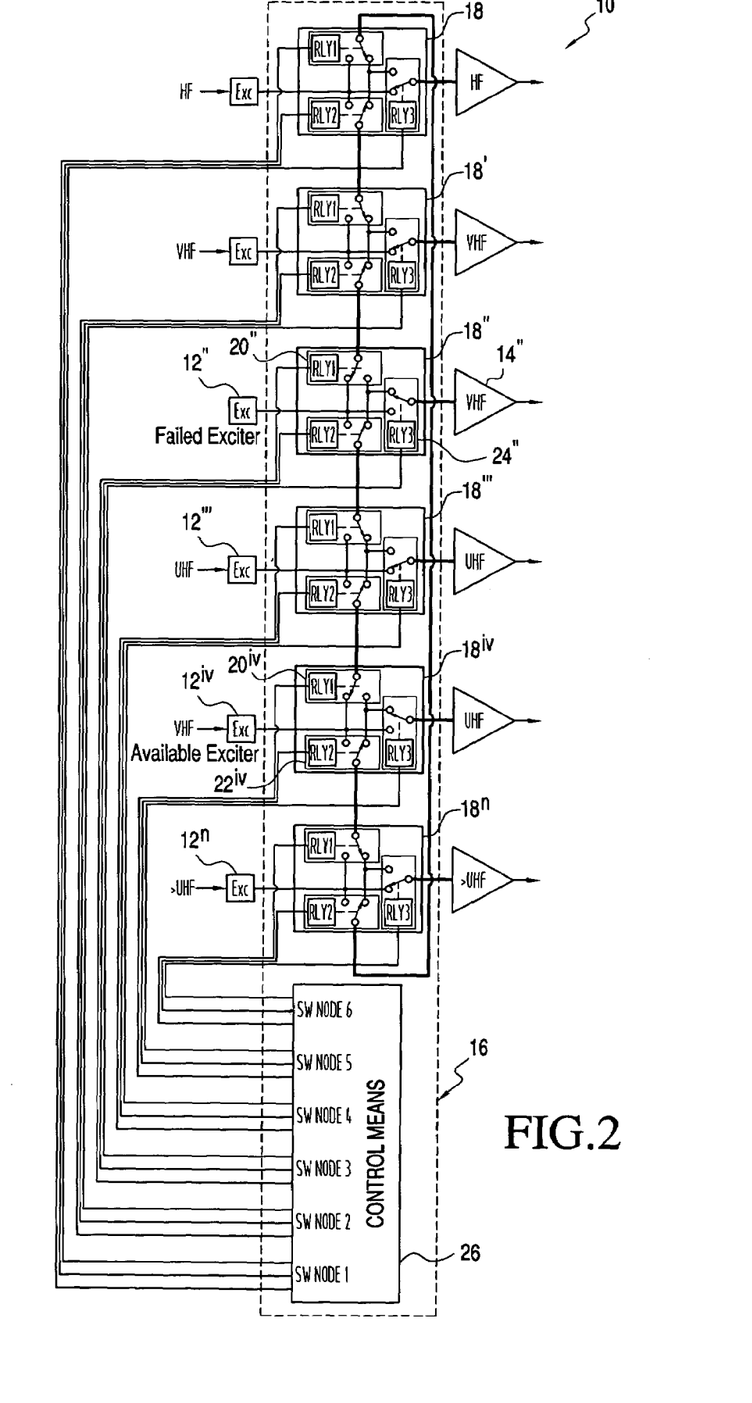
FIG. 2 is a schematic diagram of the loop switching system with one exciter failure.

Referring now to FIG. 2, if exciter 12" fails and exciter 12$^{iv}$ is unused and thus available for redeployment, than a segment of the loop connecting all exciters is disconnected and used as a patch to connect the available exciter 12$^{iv}$ to the amplifier 14" previously connected to the failed exciter 12". Thus, relay 20$^{iv}$ is switched so that the segment of the loop passing through 12''' becomes such a patch. The third relay, i.e. relay 24", of node 18", is switched to connect to the patch. The failed exciter, i.e. exciter 12", is disconnected from its associated amplifier 14" by this action. It is benignly connected through the remaining loop (i.e. through switch nodes 18, 18', 18''' and 18$^{iv}$) by the switching of first relay 20" and second relay 22$^{iv}$.

It is emphasized that this will work identically and equally well to route around a failed amplifier, connecting its exciter to a spare amplifier.

Furthermore, although the present invention has been discussed relative to its application with exciters and amplifiers relative to a radio switching system, the principles herein are applicable for a wide variety of applications where switching is required between multiple sources and multiple "sinks". For example, it may be used in a wide variety of applications such as, for example, optical switching, data communication such as the RS232 data interface, RF analog switching, electrical and optical communications, power industry related switching requirements, pneumatic switching, and hydraulic switching. In this view the terms "signal source" and "signal sink" are defined broadly to include devices that generate a form of energy (i.e., voltage, light, fluid pressure, etc.) that has some useful user-defined functionality, and devices that receive the same form of energy, respectively. Additionally, the term "signal" is also defined broadly to include, for example, electrical current, photonic energy, pulses of fluid pressure and other such physical means for conveying energy and or information. Similarly, the term "relay" is also defined broadly to include, for example, electronic switches, photonic switches, valves, etc.

Figure 3:
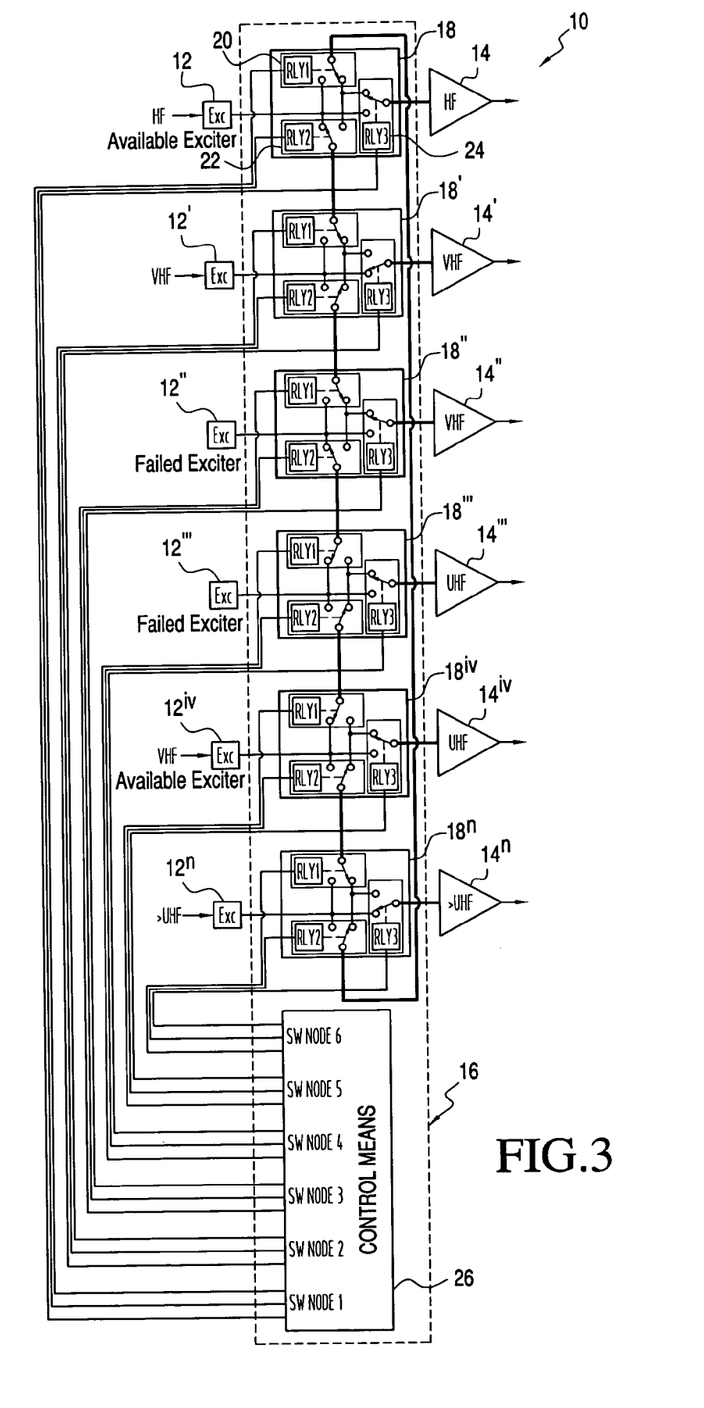
FIG. 3 is a schematic diagram of the loop switching system with two adjacent exciter failures.

FIG. 3 shows the same three relay loop switching scheme with two adjacent exciters (12" and 2''') failed. Again, available exciters (12 and 12$^{iv}$) can be rerouted, and the unused exciters and amplifiers are harmlessly connected to the loop or disconnected entirely from the system. In this instance available exciter 12$^{iv}$ becomes patched through to node 18''' and connected to amplifier 14'''. Available exciter 12 gets patched through the portion of the loop through node 18' and is connected to amplifier 14'. Any number of active, normal exciter/amplifier pairs could separate the failed and replacement exciters with no change in the switching scheme.

Figure 4:
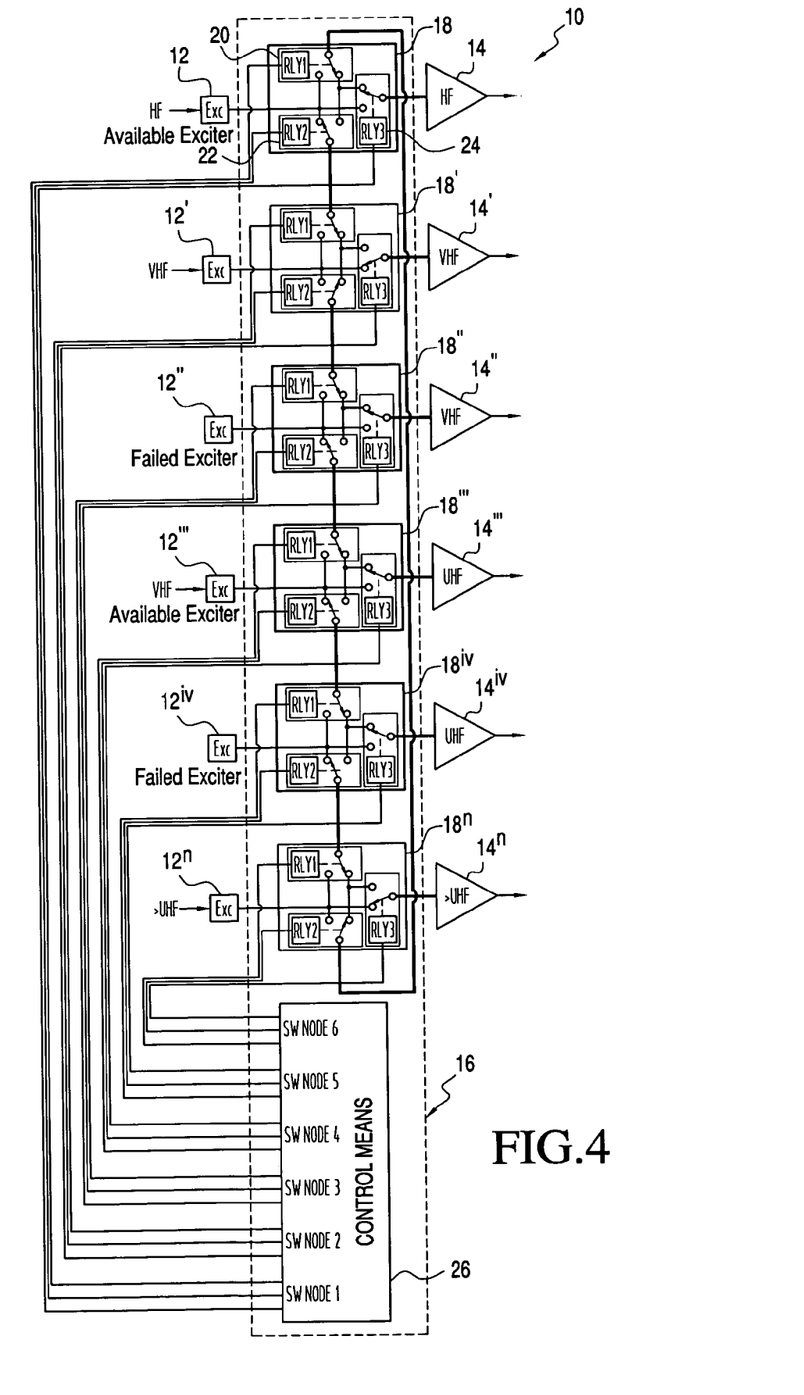
FIG. 4 is a schematic diagram of the loop switching system with two separated exciter failures.

FIG. 4 shows the same three relay loop switching scheme with two exciters failed (i.e. exciters 12" and 12$^{iv}$) but interleaved with other working exciters. This example shows that two such failures can be bypassed using loop switching, with the failed exciters (12" and 12$^{iv}$) again benignly connected to the unused amplifiers (14''' and 14$^{iv}$) by the loop segments. Available exciters (12 and 12''') are connected to amplifiers (14" and 14$^{iv}$) of the failed exciters.

Figure 5:
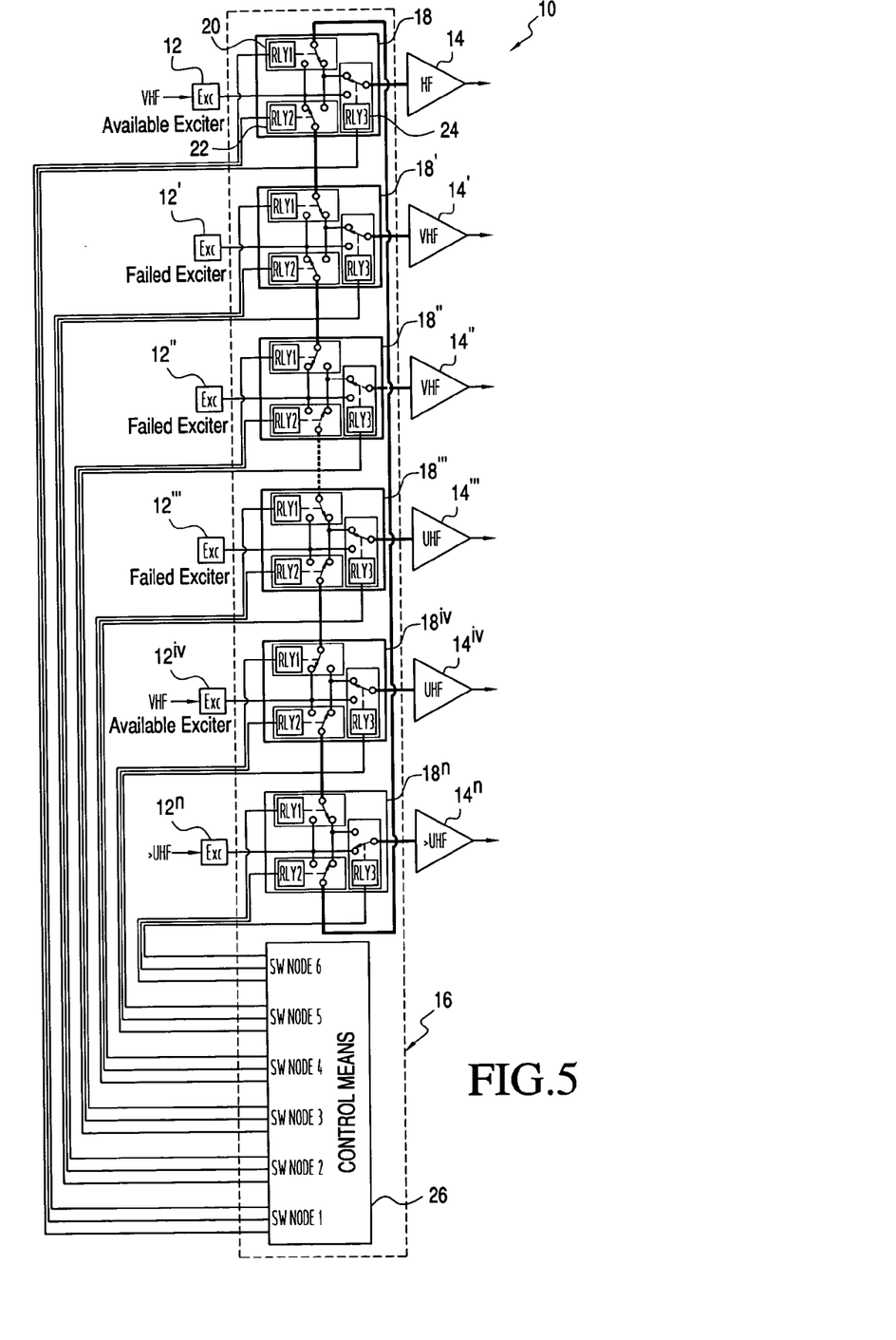
FIG. 5 is a schematic diagram of the loop switching system with three or more adjacent exciter failures.

FIG. 5 shows three adjacent exciters (12', 12", 12''') failed. (The same scenario applies if there are more than three adjacent failed exciters.) In this case, the loop segment switching can only reroute two exciters to replace any two of the failed adjacent block of exciters. This is because there is only one loop path available from either side of the failed block, and thus only two rerouting paths into the block. It can only reroute up to two adjacent failed units, while capable of rerouting any number of non-adjacent failed units within the system. The reason is as follows: There is only one signal path through a set of relays 1, 2 and 3 between two adjacent switch nodes. If that path is in use (e.g., connected to an adjacent exciter), then there is no second path available that provides a parallel signal path through that switch node. Again, failed exciters and unused amplifiers are benignly connected to loop segments.

Figure 6:
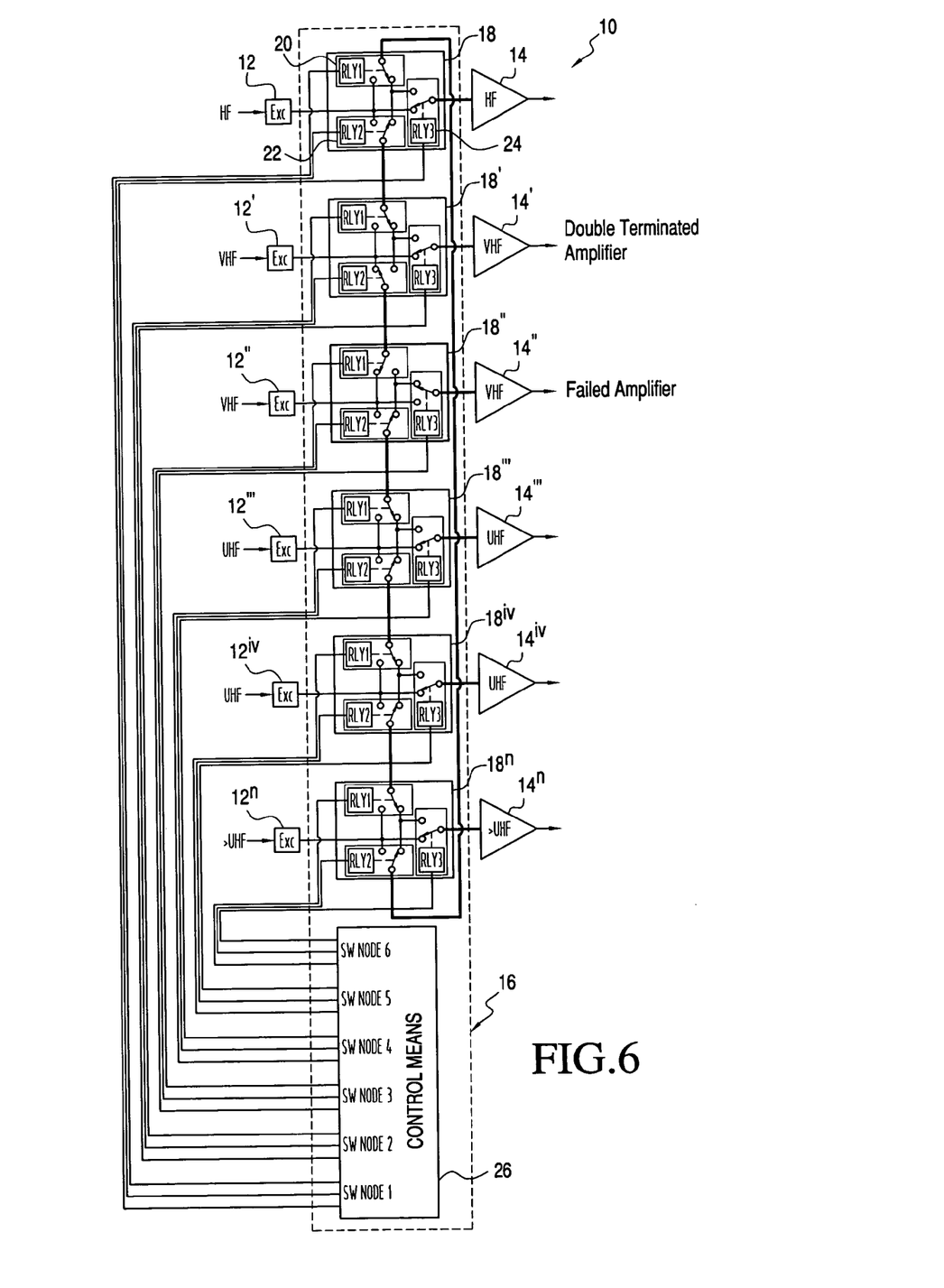
FIG. 6 is a schematic diagram of the loop switching system with multiple exciters switched into a single amplifier on amplifier failure.

FIG. 6 shows the impact of an amplifier failure. As with the failed exciter, the loop segment switching scheme allows an "orphaned" exciter output to be rerouted to an unused or spare amplifier on the loop. The loop segment scheme of the present invention also allows multiple exciters to be connected to the input of a single amplifier in an emergency. In this case the output of an "orphaned" exciter 12" and the output of exciter 12' can be safely double terminated into amplifier 14'. With multiple exciters connected, the double termination seen by each exciter will lower the power by 3 db (for a 50 ohm standard system) without harming the exciter. The amplifier will amplify and output BOTH signals (one from each exciter) with the power per channel divided by the square of the number of equal signals present. Intermodulation products will be generated, but these can likely be dealt with in an emergency. It will likely be necessary to reduce the exciter output power via a software command to avoid overdriving the amplifier.

Figure 7:
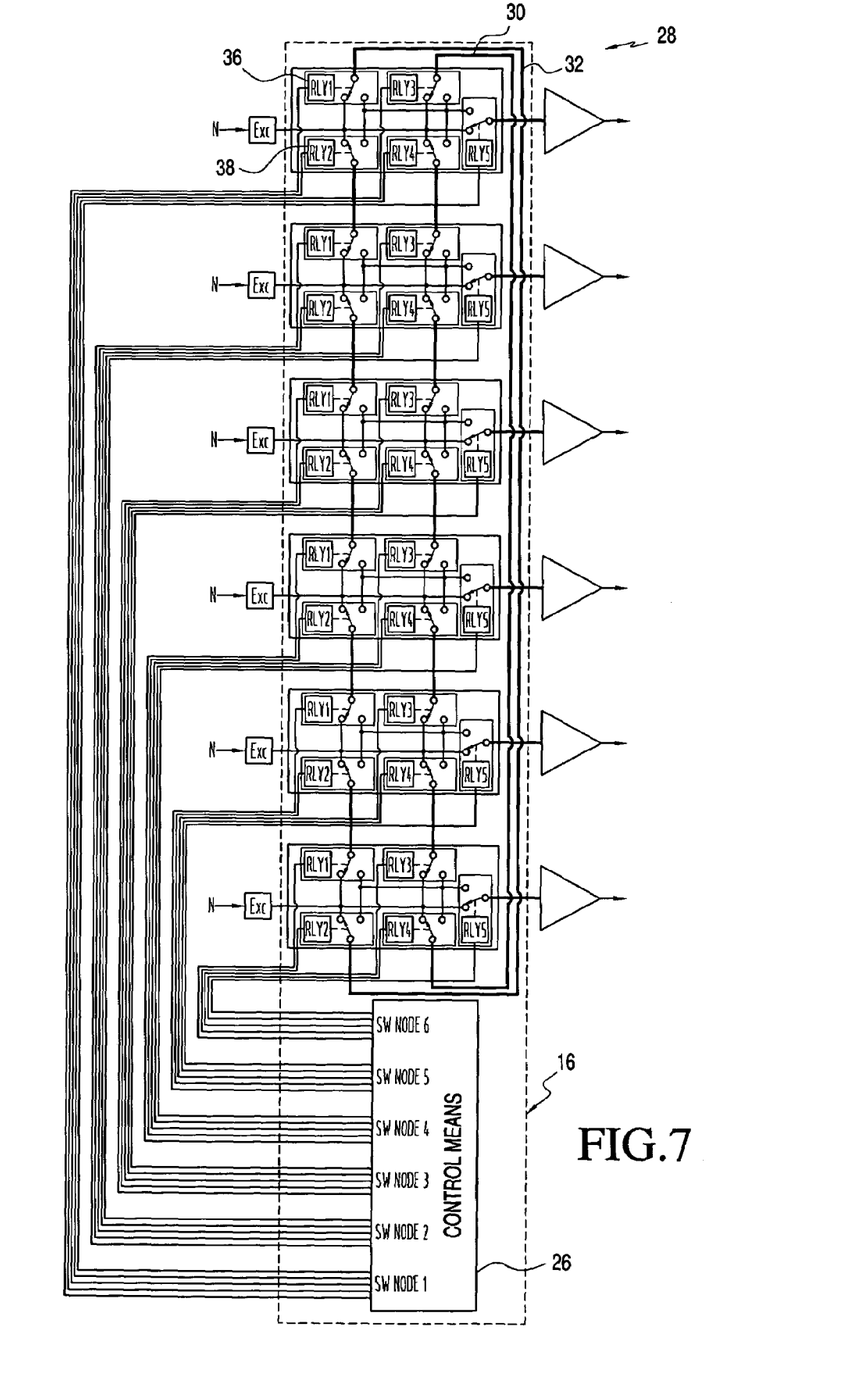
FIG. 7 is a schematic diagram of a two loop embodiment of the switching system of the present invention with all exciters operating with no failures.
Figure 8:
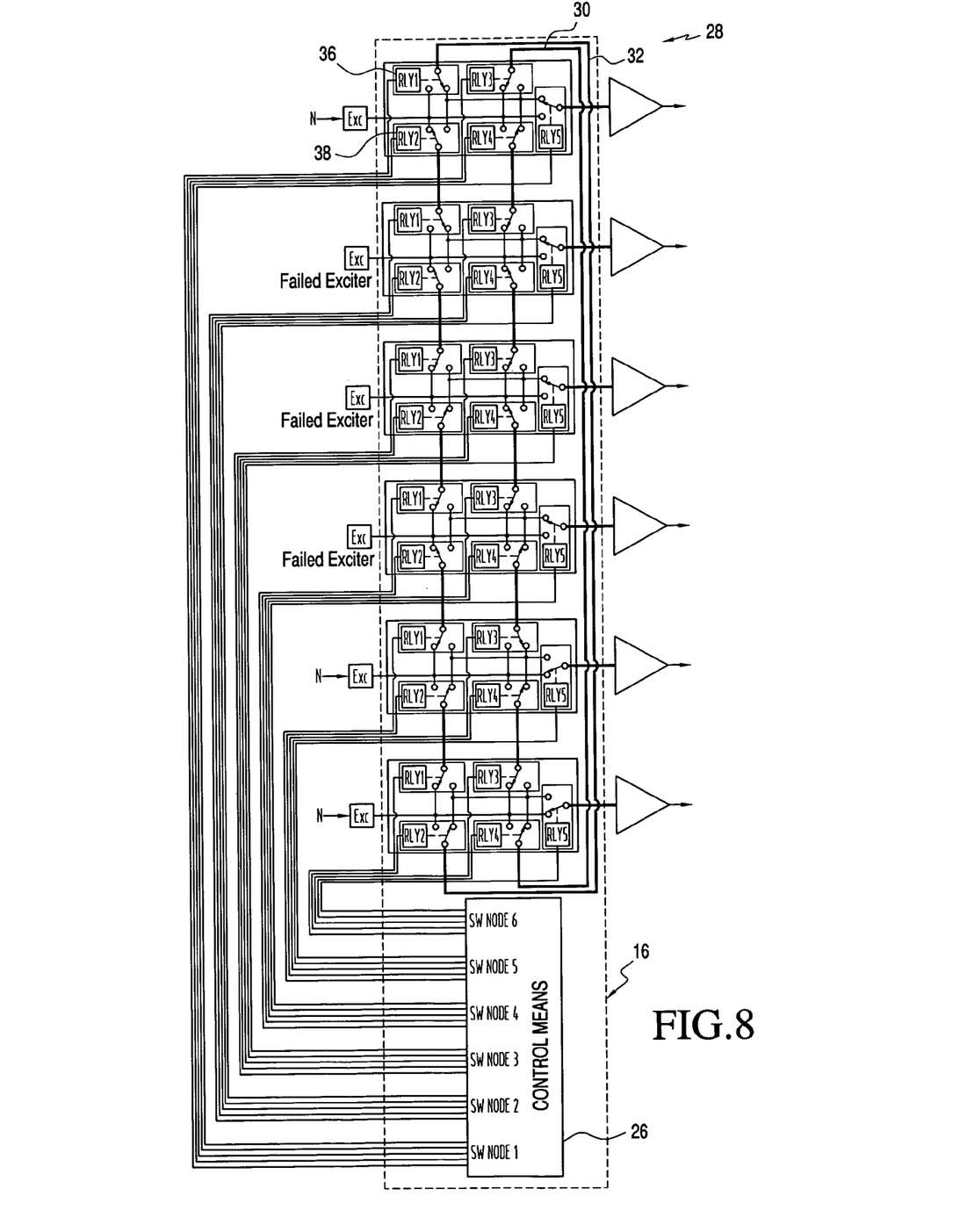
FIG. 8 is a schematic diagram of the loop switching system of FIG. 7 with three adjacent exciter failures.

Referring now to FIG. 7, an extension of the loop segment switching scheme can be seen which implements multiple independent loops by adding two relays to each switching node, the embodiment of FIG. 7 being designated generally as 28. In FIG. 7 there are two loops 30, 32, shown with all exciters operating with no failures. In this two loop embodiment, each switch node 34 includes two additional relays 36, 38 (making up fourth and fifth relays but labeled RLY1 and RLY2 for the purposes of greater clarity in the discussion below). The added loop 32 allows cross-patching, e.g., patching around connections from another loop, that would not have been possible using a single loop. For example, the prior example where three adjacent exciter failures could only have two replacements reconnected (due to limitations of a single loop patching scheme) is easily serviced by a two loop scheme. FIG. 8 illustrates such a two loop scheme with three adjacent exciter failures.

Figure 9:
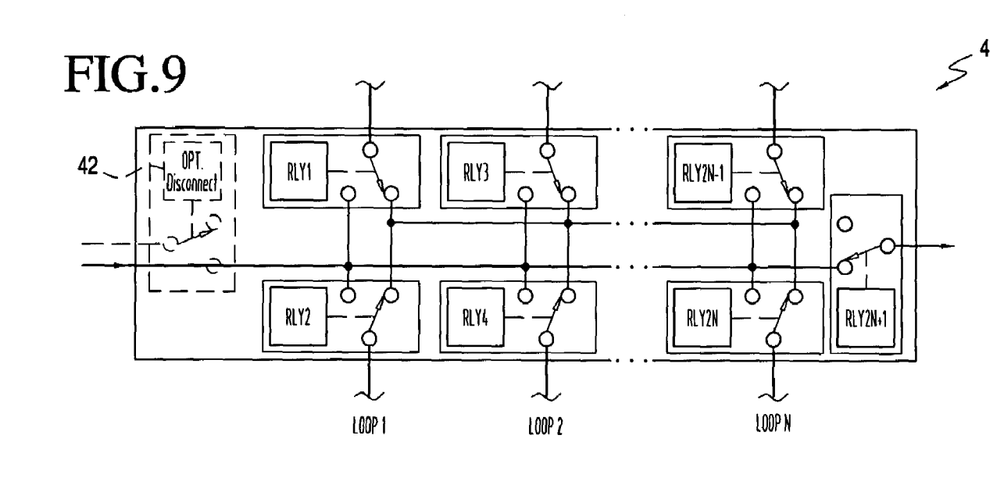
FIG. 9 illustrates a switch node for a multiple loop embodiment of the switching system of the present invention.

In general, the number of adjacent failures that can be reconnected is equal to two times the number of loops. The number of switches (i.e. relays, valves, etc.) per node is equal to 2N+1, where N is the number of loops. FIG. 9 illustrates a multiple loop embodiment, designated generally as 40, showing the general N-Loop case.

As mentioned above there are several advantages of utilizing the loop segment switching scheme of the present invention. Reliability of the system is enhanced by implementing a switching scheme with far fewer switches. The loop segment switch may be implemented with a wide variety of types of switches: relay, rotary, electronic, etc. The loop segment switch is easily expanded or shrunk in the field by adding or removing nodes to the loop, without modifications to the remainder of the system. The system may be easily divided in the field into subloops for purposes of grouping similar assets if desired, thereby simplifying the control and rerouting rules.

Figure 10:
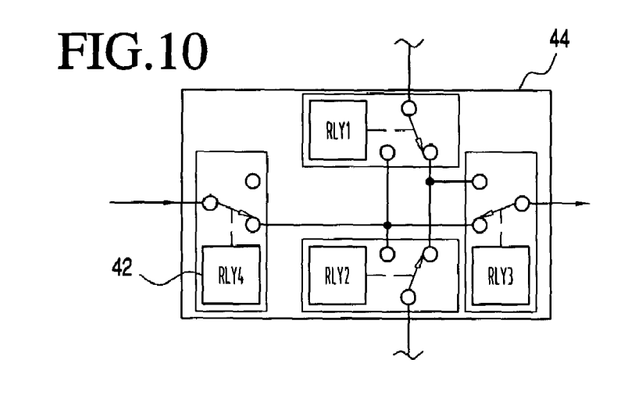
FIG. 10 illustrates a basic switch node of the present invention with a disconnect relay added thereto.

In such cases as a failed signal source does not disconnect automatically from its switch connection, it may be desirable to add an additional relay to each switch node. Referring now to FIG. 10, such a fourth (i.e. disconnect) relay 42 is shown added to a basic switch node 44. The sole purpose of this disconnect relay 42 is to disconnect the source from the switch node in event of source failure. This has no further impact on the design and intent of the invention other than to remove potential loading effects of the source. Referring again to FIG. 9, such a disconnect relay 42 is shown applied in a switch node 40 of the multiple loop embodiment.

Other embodiments and configurations may be devised without departing from the spirit of the invention and the scope of the appended claims.

The invention claimed is:

1. A loop segment switching system for switching among signal sources and signal sinks, comprising:
    a plurality of signal sources, each producing an output signal;
    a plurality of signal sinks, each signal sink normally accepting an output signal from an associated signal source and for increasing the power of said output signal to a desired level; and,
    a node switching system, comprising:
        a plurality of switch nodes, each switch node comprising a first relay, a second relay, and a third relay, associated signal sources and amplifiers normally connected to each other via said third relay, said switch nodes being normally connected in a continuous interconnecting loop from said first relay of a node to said second relay of an adjacent node; and,
        control means connected to said plurality of switch nodes for activating said plurality of switch nodes in order to reconnect signal sources and signal sinks from said normal connection in the event of a failure of a signal source or a signal sink, said reconnections being implemented by disconnecting a segment of said interconnecting loop and using that segment as a connection between the desired signal source and signal sink.

2. The loop segment switching system of claim 1 wherein said signal sources comprise exciters.

3. The loop segment switching system of claim 1 wherein said signal sinks comprise amplifiers.

4. The loop segment switching system of claim 1 wherein said signal sources, signal sinks, and said node switching system comprises components of a modular, multiple radio system.

5. The loop segment switching system of claim 1 wherein said control means comprises a computer and associated software.

6. The loop segment switching system of claim 1 wherein said node switching system comprises an electronically operated node switching system.

7. The loop segment switching system of claim 1 wherein each switch node further comprises a fourth and fifth relay said switch nodes being further normally connected in a second continuous interconnecting loop from said fourth relay of a node to said fifth relay of an adjacent node, said control means being operatively connected to said fourth and fifth relays to provide an additional basis for reconnecting signal sources and signal sinks from said normal connection in the event of a failure of a signal source or a signal sink, a segment of said second interconnecting loop being used as a connection between a desired signal source and signal sink.

8. The loop segment switching system of claim 7, wherein each switch node further comprises additional pairs of relays being further normally connected in additional continuous interconnecting loops from a first relay of said additional pair to a second relay of an additional pair of an adjacent node, said control means being operatively connected to said additional pairs of relays to provide additional bases for reconnecting signal sources and signal sinks from said normal connection in the event of a failure of a signal source or a signal sink, segments of said additional interconnecting loops being used as connections between desired signal sources and signal sinks.

9. The loop segment switching system of claim 1 wherein each switch node further comprises a disconnect relay for disconnecting the source from the switch node in the event of a source failure.

10. The loop segment switching system of claim 1 wherein said control means comprises means for selecting switch node relay positions based upon operator inputs and/or failure information from said exciters and/or amplifiers where preprogrammed rules determine said reconnections.

11. A loop segment switching system for a modular, multiple radio system, comprising:
    a plurality of exciters, each producing an output signal;
    a plurality of amplifiers, each amplifier normally accepting an output signal from an associated exciter and for increasing the power of said output signal to a desired level; and,
    an electronically operated node switching system, comprising:
        a plurality of switch nodes, each switch node comprising a first relay, a second relay, and a third relay, associated exciters and amplifiers normally connected to each other via said third relay, said switch nodes being normally connected in a continuous interconnecting loop from said first relay of a node to said second relay of an adjacent node; and,
        control means connected to said plurality of switch nodes for activating said plurality of switch nodes in order to reconnect exciters and amplifiers from said normal connection in the event of a failure of an exciter or an amplifier, said reconnections being implemented by disconnecting a segment of said interconnecting loop and using that segment as a connection between the desired exciter and amplifier.

12. The loop segment switching system of claim 11 wherein said control means comprises a computer and associated software.

13. The loop segment switching system of claim 11 wherein each switch node further comprises a fourth and fifth relay said switch nodes being further normally connected in a second continuous interconnecting loop from said fourth relay of a node to said fifth relay of an adjacent node, said control means being operatively connected to said fourth and fifth relays to provide an additional basis for reconnecting exciters and amplifiers from said normal connection in the event of a failure of an exciter or an amplifier, a segment of said second interconnecting loop being used as a connection between the desired exciter and amplifier.

14. The loop segment switching system of claim 13, wherein each switch node further comprises additional pairs of relays being further normally connected in additional continuous interconnecting loops from a first relay of said additional pair to a second relay of an additional pair of an adjacent node, said control means being operatively connected to said additional pairs of relays to provide additional bases for reconnecting exciters and amplifiers from said normal connection in the event of a failure of an exciter or an amplifier, segments of said additional interconnecting loops being used as connections between desired exciters and amplifiers.

15. A method for switching among signal sources and signal sinks, comprising the steps of:
  providing a plurality of signal sources, each producing an output signal;
  providing a plurality of signal sinks, each signal sink normally accepting an output signal from an associated signal source and for increasing the power of said output signal to a desired level;
  providing a node switching system, said node switching system, comprising:
    a plurality of switch nodes, each switch node comprising a first relay, a second relay, and a third relay, associated signal sources and amplifiers normally connected to each other via said third relay, said switch nodes being normally connected in a continuous interconnecting loop from said first relay of a node to said second relay of an adjacent node; and,
    a control system connected to said plurality of switch nodes; and,
  switching among signal sources and signal sinks in the event of a failure of a signal source or a signal sink by reconnecting signal sources and signal sinks from said normal connection, said reconnections being implemented by disconnecting a segment of said interconnecting loop and using that segment as a connection between the desired signal source and signal sink.

16. The method of claim 15 wherein said step of providing signal sources comprises providing exciters.

17. The method of claim 15 wherein said step of providing signal sinks comprises providing amplifiers.

18. The method of claim 15 wherein said signal sources, signal sinks, and said node switching system comprises components of a modular, multiple radio system.

19. The method of claim 15 wherein each switch node further comprises a fourth and fifth relay said switch nodes being further normally connected in a second continuous interconnecting loop from said fourth relay of a node to said fifth relay of an adjacent node,
  said step of switching among signal sources and signal sinks comprising the additional step of disconnecting a segment of said second continuous interconnecting loop and utilizing said segment as a connection between a desired signal source and signal sink.

20. The method of claim 19 wherein each switch node further comprises additional pairs of relays being further normally connected in additional continuous interconnecting loops from a first relay of said additional pair to a second relay of an additional pair of an adjacent node,
  said step of switching among signal sources and signal sinks comprising the additional steps of disconnecting segments of said additional continuous interconnecting loops and utilizing said segments as connections between desired signal sources and signal sinks.

* * * * *